United States Patent [19]
Eklund et al.

[11] Patent Number: 5,077,228
[45] Date of Patent: Dec. 31, 1991

[54] PROCESS FOR SIMULTANEOUS FORMATION OF TRENCH CONTACT AND VERTICAL TRANSISTOR GATE AND STRUCTURE

[75] Inventors: Robert H. Eklund, Plano; Roger Haken, Dallas, both of Tex.

[73] Assignee: Texas Instruments Incorporated, Dallas, Tex.

[21] Appl. No.: 444,508

[22] Filed: Dec. 1, 1989

[51] Int. Cl.$^5$ .............................................. H01L 21/70
[52] U.S. Cl. ...................................... 437/40; 437/29; 437/38; 437/41; 437/54; 437/59; 437/203; 437/233; 437/235
[58] Field of Search .................. 437/38, 40, 41, 29, 437/89, 81, 54, 203, 228, 233, 56, 57, 59, 67; 357/23.4, 55; 156/643, 644, 656

[56] References Cited

U.S. PATENT DOCUMENTS

| | | | |
|---|---|---|---|
| 4,116,720 | 9/1978 | Vinsom | 437/26 |
| 4,454,647 | 6/1984 | Joy et al. | 437/31 |
| 4,473,598 | 9/1984 | Ephrath et al. | 437/89 |
| 4,520,552 | 6/1985 | Arnould et al. | 437/203 |
| 4,689,871 | 9/1987 | Malhi | 437/225 |
| 4,745,081 | 5/1988 | Beyer et al. | 437/78 |
| 4,803,535 | 2/1989 | Taguchi | 357/23.6 |
| 4,816,421 | 3/1989 | Dynes et al. | 437/26 |
| 4,829,017 | 5/1989 | Malhi | 437/23.3 |
| 4,847,214 | 7/1989 | Robb et al. | 437/78 |
| 4,873,560 | 10/1989 | Sunami et al. | |
| 4,910,567 | 3/1990 | Malhi | 357/23.4 |
| 4,918,502 | 4/1990 | Kaya et al. | 357/23.6 |

FOREIGN PATENT DOCUMENTS

| | | | |
|---|---|---|---|
| 0137647 | 10/1981 | Japan | 437/67 |
| 0165435 | 9/1984 | Japan | 437/67 |
| 0170250 | 9/1985 | Japan | 437/67 |
| 0216456 | 9/1986 | Japan | 437/67 |
| 0245629 | 10/1987 | Japan | 437/67 |
| 0276850 | 12/1987 | Japan | 437/67 |
| 0116445 | 5/1988 | Japan | 437/203 |

Primary Examiner—Brian E. Hearn
Assistant Examiner—Tom Thomas
Attorney, Agent, or Firm—Douglas A. Sorensen; James T. Comfort; Melvin Sharp

[57] ABSTRACT

The described embodiments of the present invention provide structures and methods for fabricating the structures which provide compact contact from the surface of an integrated circuit to a buried layer formed in conjunction with a vertical gate extending from the buried layer to a doped layer at a surface of the integrated circuit. In one embodiment, trenches are simultaneously formed for providing the vertical gate and the contact to the buried layer. A thermal oxide layer is formed on the surface of the integrated circuit to provide an insulating layer on the surfaces of both the contact trench and the gate trench. A first layer of in situ doped polycrystalline silicon is deposited on the surface of the integrated circuit. The thickness of this polycrystalline silicon layer is chosen so as to not fill the gate and contact trenches. A masking layer is then provided to protect the gate trench and expose the contact trench. An anisotropic etching process is then performed which removes the bottom portion of the polycrystalline silicon layer and the thus exposed portion of the gate oxide at the bottom of the contact trench. The masking layer is removed and the balance of the trenches is filled with a second in situ doped polycrystalline silicon layer which fills the gate trench to provide a high conductivity vertical gate and fills the contact trench. At the bottom of the contact trench, the second polycrystalline silicon layer is in contact with the substrate, some of the dopant atoms in the first and second polycrystalline silicon layers will diffue into the buried layer.

10 Claims, 6 Drawing Sheets

PROCESS FOR SIMULTANEOUS FORMATION OF TRENCH CONTACT AND VERTICAL TRANSISTOR GATE AND STRUCTURE

FIELD OF THE INVENTION

The present invention relates to the field of integrated circuit fabrication. More specifically, the present invention relates to the fabrication of vertical structures in integrated circuitry.

BACKGROUND OF THE INVENTION

With the rapid development of combination bipolar/complementary metal-oxide-semiconductor (BiCMOS) integrated circuitry, it has been noted in the art that the buried doped layers used to form the collectors of bipolar transistors may be used as buried source/drains in MOS transistors with a vertical gate extending from the buried layer to a surface doped layer. Contact from the surface to the buried layer is then made thus providing a vertical field effect transistor. The motivation for providing a vertical field effect transistor is that the surface area utilized by the transistor may be minimized while maintaining a gate length (i.e., the distance from the source to the drain) which will minimize punch-through, leakage and hot electron problems. Thus, a compact and robust structure may be fabricated. However, contact to the buried layers are usually achieved by forming a doped layer from the surface to the buried layer. The fabrication of a doped layer of this depth, tends to provide a great deal of lateral diffusion and thus does not provide a compact structure, in terms of integrated circuit surface area. Thus, the space savings gained by providing a vertical transistor is lost by providing complete functionality for this vertical transistor.

One method for providing a contact to the buried layer which requires less area is shown in Eklund, et al., U.S. patent application Ser. No. 178,728, filed Apr. 7, 1988 and assigned to the assignee of this application. In Eklund, et al. a trench is formed in the surface of an integrated circuit extending down to the buried contact. An insulating layer is formed on the sidewalls of the trench and the bottom part of the insulating layer is opened by anisotropic etching. The trench is then filled with conductive material. This process is incompatible with the formation of vertical gates because the gate oxide in the trench for the vertical gates must remain in tact. Therefore, in the prior art, complete separate processing steps for forming vertical gates and trench contacts must be provided.

SUMMARY OF THE INVENTION

The described embodiments of the present invention provide structures and methods for fabricating the structures which provide compact contact from the surface of an integrated circuit to a buried layer formed in conjunction with a vertical gate extending from the buried layer to a doped layer at the surface of the integrated circuit. In one embodiment, trenches are simultaneously formed for providing the vertical gate and the contact to the buried layer. A thermal oxide layer is formed on the surface of the integrated circuit to provide an insulating layer on the surfaces of both the contact trench and the gate trench. A first layer of in situ doped polycrystalline silicon is deposited on the surface of the integrated circuit. The thickness of this polycrystalline silicon layer is chosen so as to not fill the gate and contact trenches. A masking layer is then provided to protect the gate trench and expose the contact trench. An anisotropic etching process is then performed which removes the bottom portion of the polycrystalline silicon layer and the thus exposed portion of the gate oxide at the bottom of the contact trench. The masking layer is removed and the balance of the trenches is filled with a second in situ doped polycrystalline silicon layer which fills the gate trench to provide a high conductivity vertical gate and fills the contact trench. At the bottom of the contact trench, the second polycrystalline silicon layer is in contact with the substrate, some of the dopant atoms in the first and second polycrystalline silicon layers will diffuse into the buried layer. Because the buried layer is of the same conductivity type as the doping of the contact, a high quality conductive contact is provided between the buried layer and the surface of the integrated circuit.

DETAILED DESCRIPTION

FIGS. 1 through 16 are side view schematic diagrams showing the processing steps necessary to fabricate one embodiment of the present invention. The processing steps are also another embodiment of the present invention.

Figure 1:
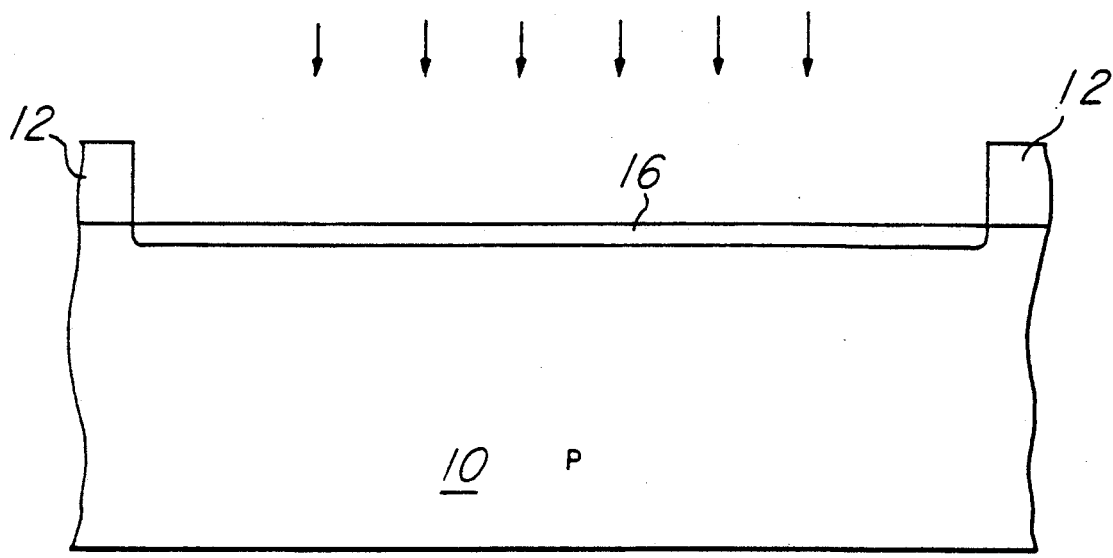
FIGS. 1 through 16 are side view schematic diagrams showing the processing steps necessary to provide one embodiment of the present invention using a method which is another embodiment of the present invention.

The process starts with a single crystal silicon substrate 10 which is doped P type as shown in FIG. 1. A layer of silicon dioxide 12 is formed using thermal oxidation in a steam ambient at approximately 900° C. for approximately 4 hours and 51 minutes to a thickness of approximately 5,000 Angstroms. Using common photolithographic techniques, silicon dioxide layer 12 is patterned and etched to provide the structure shown in FIG. 1. The structure of FIG. 1 is then subjected to an ion implantation of antimony ions having an energy of approximately 40 kiloelectron volts at a density of approximately $3.0 \times 10^{15}$ ions/centimeter$^2$. This forms doped region 16, as shown in FIG. 1.

Figure 2:
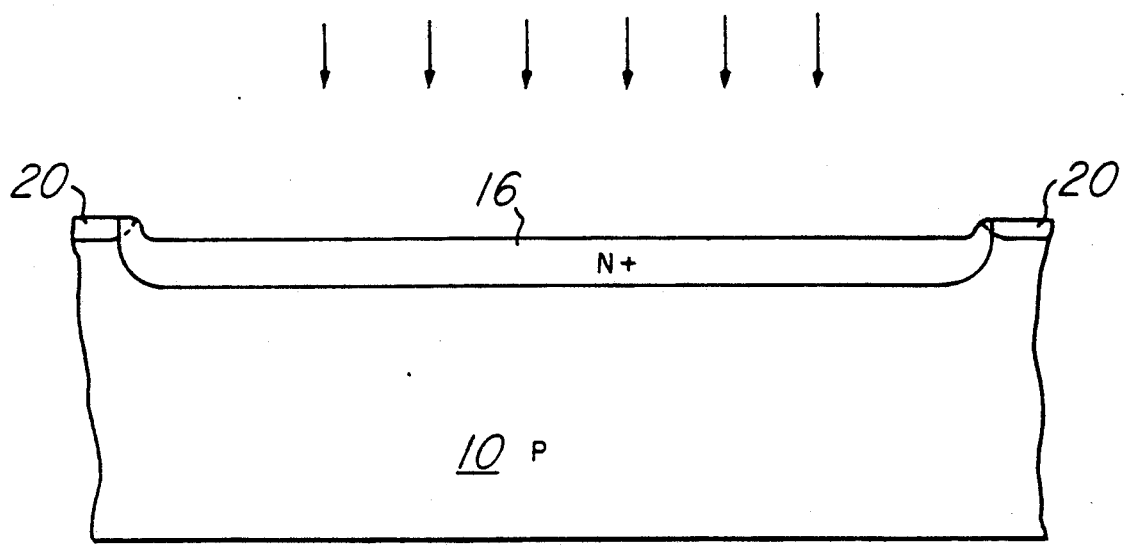
Figure 3:
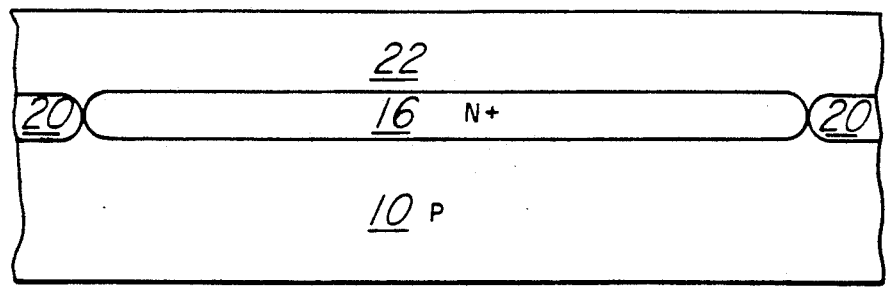

The structure of FIG. 1 is then subjected to thermal oxidation in an $N_2/O_2$ environment at a temperature of approximately 1,250° C. for approximately 30 minutes. This forms a thick oxide layer (not shown) over doped region 16 and thin silicon dioxide layer (not shown) elsewhere due to the enhanced oxidation of doped region 16. These silicon dioxide layers are stripped using buffered HF leaving the structure of FIG. 2. The structure of FIG. 2 is then subjected to an ion implantation of boron ions at an energy of approximately 120 to 160 kiloelectron volts at a density of approximately $4 \times 10^{12}$ to $1 \times 10^{13}$ ions/centimeters$^2$. This ion implantation is not heavy enough to counter-dope doped regions 16 and the antimony ions tend to "lock up" the boron. Thus doped regions 16 are relatively unaffected by this ion implantation. The boron ions are activated to form P-doped regions 20 as shown in FIG. 2. This process is more completely described in copending U.S. patent application Ser. No. 265,074, which is assigned to the assignee of this application and which is hereby incorporated by reference. An epitaxial layer 22 is then formed on the surface of the structure FIG. 2 to provide the structure as shown in FIG. 3. Although the structure of FIG. 3 shows a smooth surface over P+ region 20 and N+ region 16, in actuality, the surface will be rather rough providing topography for the alignment of subsequent photomasks. The surface is shown as smooth for simplicity of the drawings.

Figure 4:
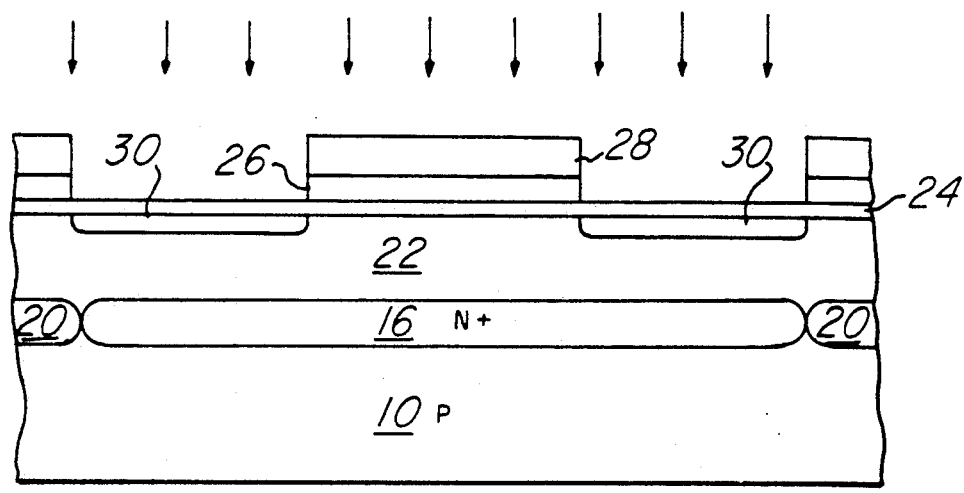

A layer of silicon dioxide 24 is then formed on the surfaces of the structure of FIG. 3 as shown in FIG. 4. Silicon dioxide layer 24 is formed by thermal oxidation to a thickness of approximately 350 Angstroms. A layer of silicon nitride 26 is then deposited by LPCVD to a thickness of approximately 1,000 Angstroms. Silicon nitride layer 26 is patterned using a layer of patterned photoresist 28 to provide the structure shown in FIG. 4. A double implant is then performed using photoresist layer 28 and silicon nitride layer 26 as an implantation mask. The first ion implantation is of phosphorous ions having an energy of approximately 70 kiloelectron volts in a density of approximately $1 \times 10^{12}$ ions/centimeter$^2$. The second ion implantation is also of phosphorous ions having an energy of approximately 350 kiloelectron volts and a density of approximately $1.2 \times 10^{12}$ ions/centimeter$^2$. These ion implantations form doped regions 30 as shown in FIG. 4.

Figure 5:
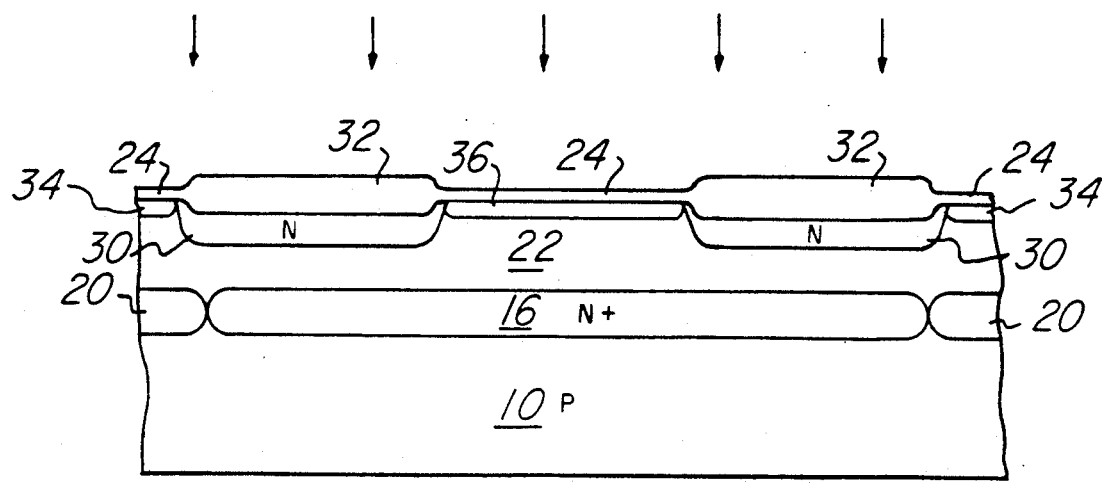

Photoresist layer 28 is then removed and the structure of FIG. 4 is subjected to thermal oxidation for approximately 190 minutes at approximately 900° C. in a steam ambient to form thick silicon dioxide regions 32 as shown in FIG. 5. During this thermal oxidation, doped regions 30 will be driven somewhat into epitaxial layer 22. Silicon nitride layer 26 is then removed using hot phosporic acid. The structure of FIG. 5 is subjected to an ion implantation of boron ions having an energy of approximately 50 kiloelectron volts and a density of approximately $1 \times 10^{12}$ ions/centimeter$^2$. This ion implantation is sufficient to penetrate silicon dioxide layer 32.

Figure 6:
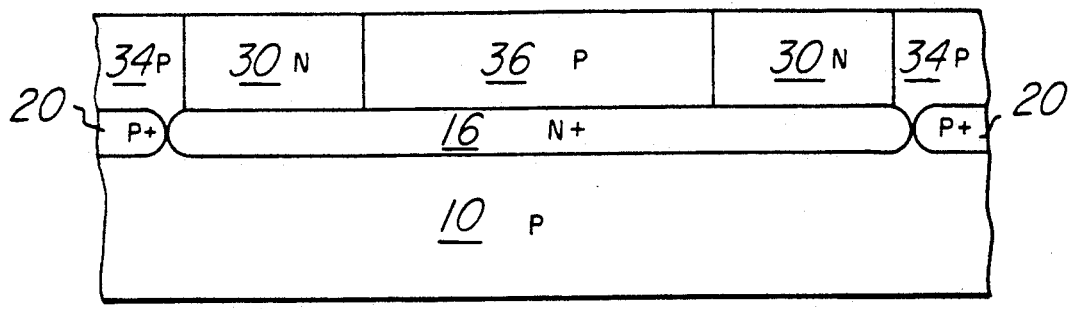

The structure of FIG. 5 is then subjected to a drive-in cycle of 150 minutes at approximately 1,000° C. in an N$_2$ ambient. This forms N wells 30 and P wells 34 and 36 as shown in FIG. 6. Silicon dioxide layers 32 and 24 are then removed using buffered hydrofluoric acid. Once again, the surface of the structure of FIG. 6 will be rather rough but, for clarity of the drawings, the surface of the structure of FIG. 6 is shown as smooth.

Figure 7:
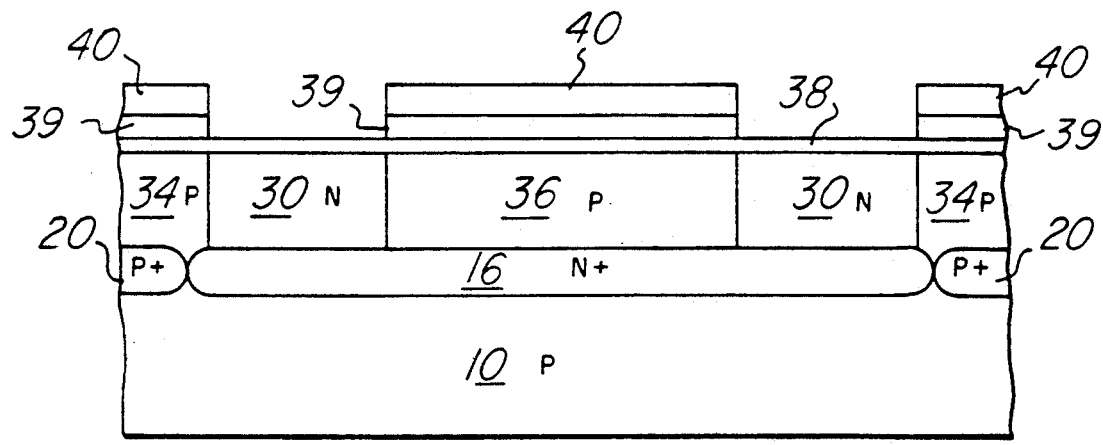

A layer of silicon dioxide 38 is then formed by thermal oxidation to a thickness of approximately 100 Angstroms as shown in FIG. 7. A layer of polycrystalline silicon is then deposited to a thickness of approximately 500 Angstroms using low pressure chemical vapor deposition. A layer of silicon nitride 40 is then deposited using low pressure chemical vapor deposition to a thickness of approximately 2,400 Angstroms.

Figure 8:
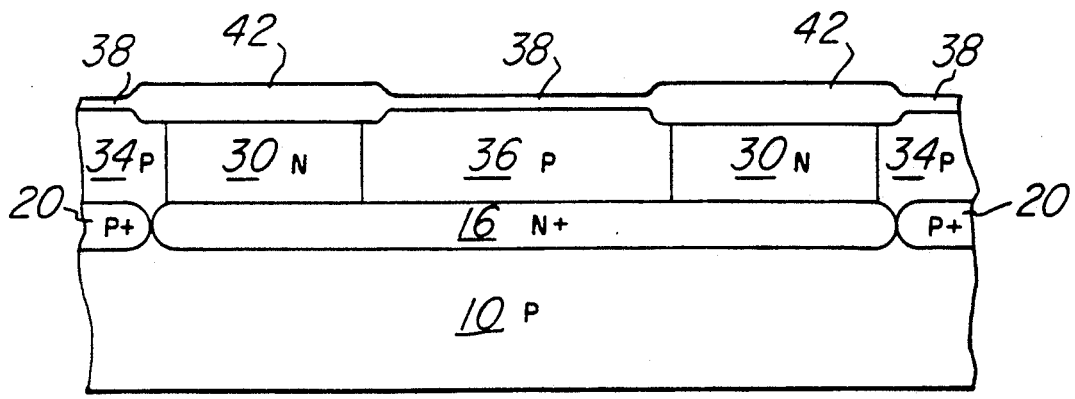
Figure 9:
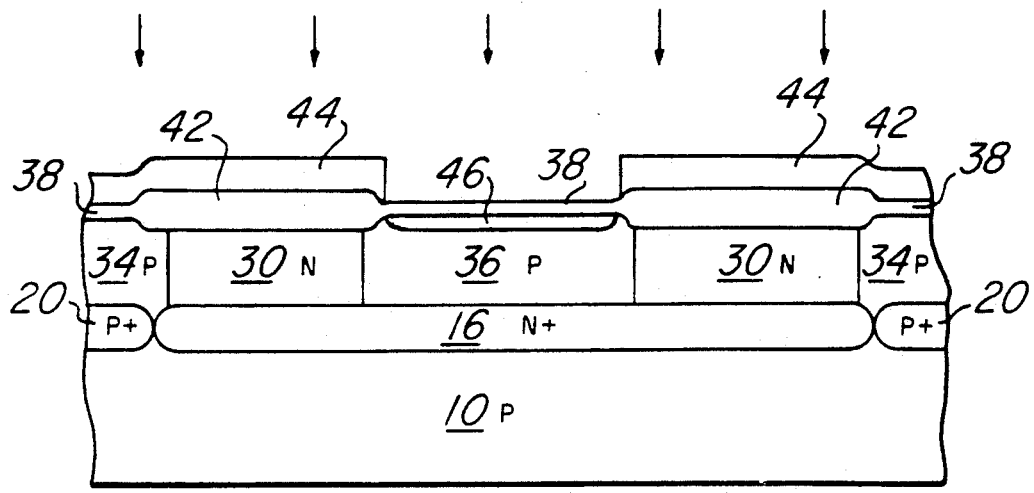

Silicon nitride layer 40 and polycrystalline silicon layer 39 are then patterned using common photolithographic etching techniques. The structure of FIG. 7 is then subjected to high pressure oxidation in an ambient of steam at 975° C. for approximately 19 minutes at a pressure of approximately 10 atmospheres to provide field oxide layers 42 as shown in FIG. 8. This method for forming thick field oxide regions is more fully explained in Havemann, et al., U.S. Pat. No. 4,541,167, issued Sept. 17, 1985 and assigned to the assignee of this application. This patent is hereby incorporated by reference. Silicon nitride layer 40 is removed using wet phosphoric acid and polycrystalline silicon layer 39 is removed using a plasma of SF$_6$. An ion implantation mask 44 comprised of patterned photoresist is deposited and patterned as shown in FIG. 9. The structure of FIG. 9 is then subjected to an ion implantation of arsenic at an energy of approximately 50 kiloelectron volts in a density of approximately $2 \times 10^{15}$ ions/centimeter$^2$. Phosphorous may also be implanted at lower doses to form a lightly doped drain structure for improved hot electron characters. Section Haken, U.S. Pat. No. 4,851,360 issued July 25, 1989, assigned to the assignee of this Application and hereby incorporated by reference. This forms drain region 46 as shown in FIG. 9. At this stage, a threshold adjustment implantation may be performed to adjust the inversion threshold of P-well 36 near where a vertical gate will be formed. An example of such an implant is an implantation of boron ions at an energy of approximately 150 kiloelection volts at a density of approximately $5 \times 10^{12}$ to $1 \times 10^{13}$ ions/centimeter$^2$.

Figure 10:
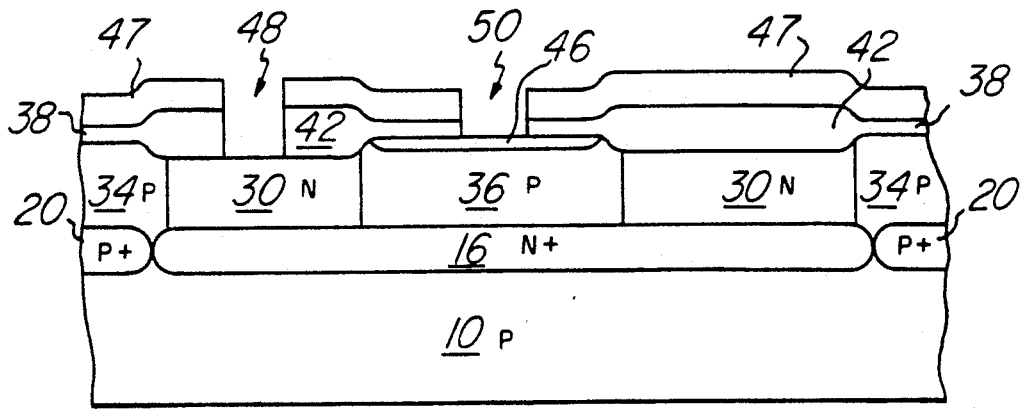
Figure 11:
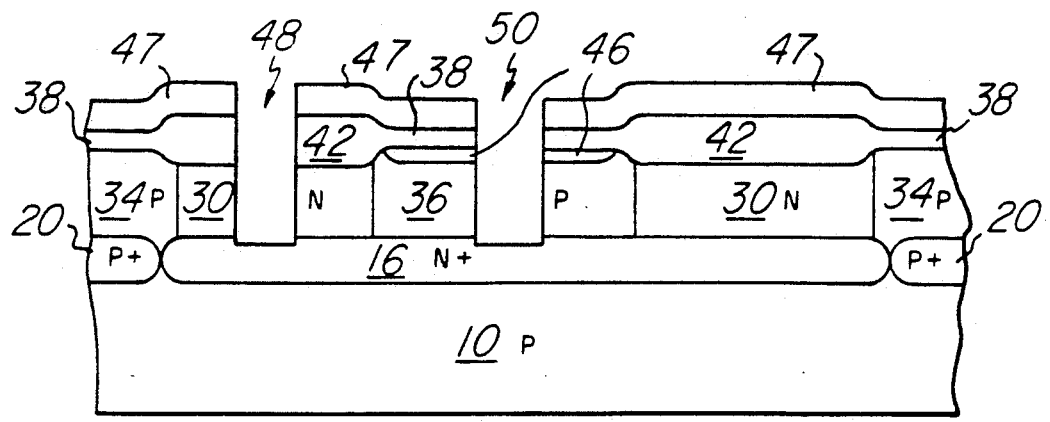
Figure 12:
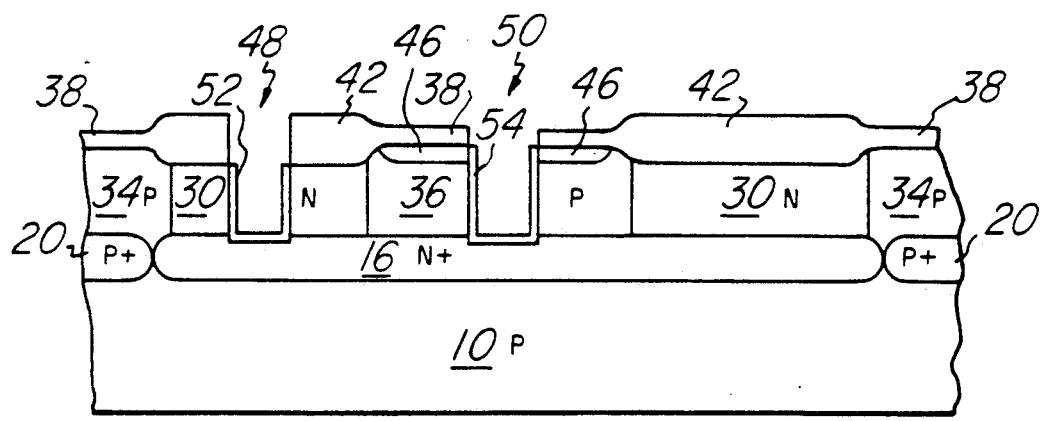
Figure 13:
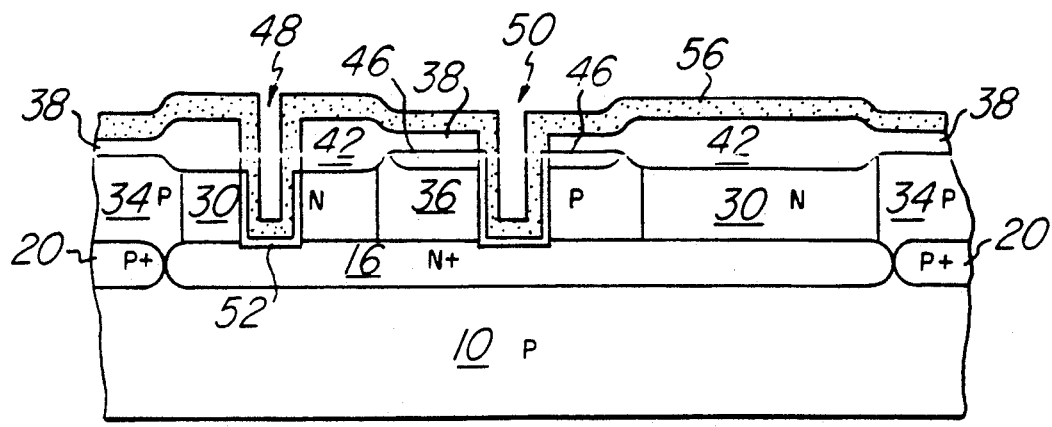

Photoresist layer 44 is then removed. A layer of silicon dioxide is deposited by LPCVD and patterned to using common photolithographic techniques to provide silicon dioxide layer 46 including openings 48 and 50 as shown in FIG. 10. The etch of Silicon dioxide layer 46 is continued to etch thick field oxide region 42 and silicon dioxide layer 38 at openings 48 and 50. The structure of FIG. 10 is then further etched using a plasma of HBr, He/O$_2$ and SF$_6$ to form trenches 48 and 50 extending into buried layer 16 as shown in FIG. 11. The trench etching process may be any of a number of known techniques. An example is shown in Douglas, U.S. Pat. No. 4,784,720, issued Nov. 15, 1988 and assigned to the assignee of this application. This patent is hereby incorporated by reference. Silicon dioxide layer 46 is then removed by using HF. A sacrificial layer of silicon dioxide (not shown) is then formed using thermal oxidation in a steam ambient at a temperature of approximately 900° C. for approximately 6 minutes to form a layer approximately 250 Angstroms thick. This sacrificial layer is the removed using buffered HF. The sacrificial layer is formed and removed to remove damage on the surfaces of the trench and provide a high quality surface for the formation of the gate oxide layer. The structure of FIG. 11 is then subjected to thermal oxidation in an O$_2$ ambient for approximately 3 minutes to provide silicon dioxide layers 52 and 54 having a thickness of approximately 120 Angstroms. A layer of polycrystalline silicon 56 is then deposited using low pressure chemical vapor deposition to a thickness of approximately 1,000 Angstroms. This thickness is chosen to be much less than one half of the width of trenches 48 and 50 so that polycrystalline silicon layer 56 will not completely fill trenches 58 and 50. Polycrystalline silicon layer 56 is doped to N+ type using in situ doping techniques.

Figure 14:
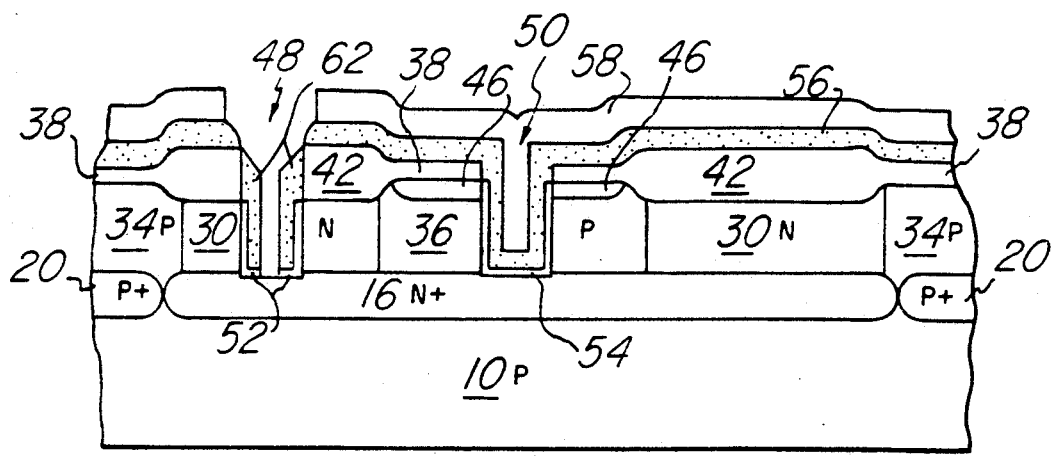
Figure 15:
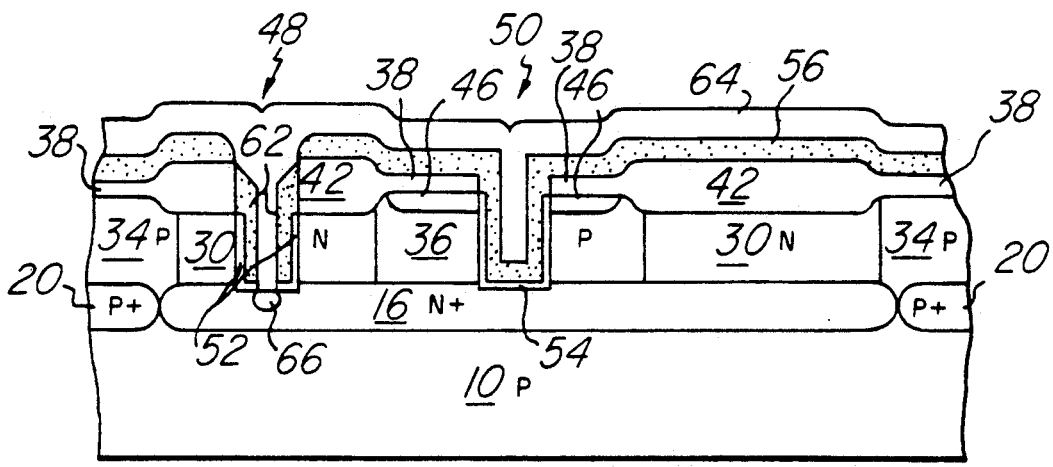
Figure 16:
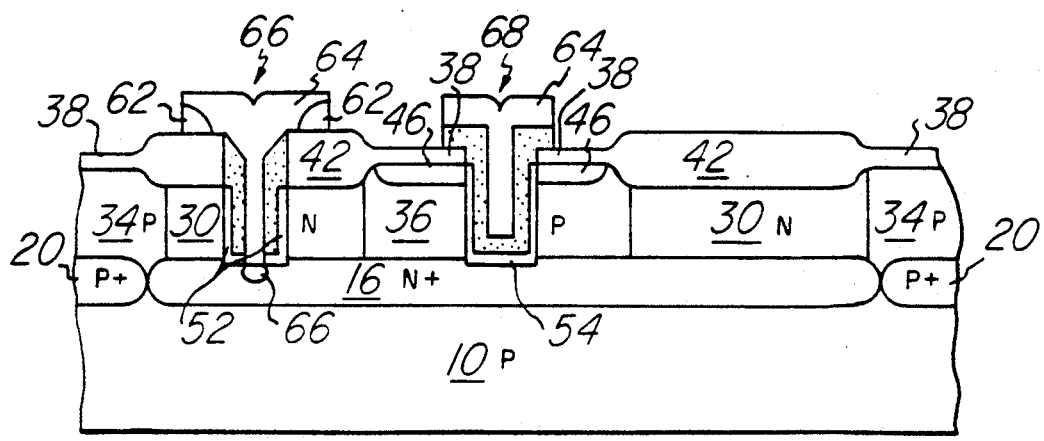

A photoresist layer 58 is then deposited and patterned as shown in FIG. 14. The structure of FIG. 14 is then subjected to a first anisotropic etching process using a plasma of HCl and HBr to anisotropically etch polycrystalline silicon layer 56, where exposed, the result of this etching step is the formation of sidewall polycrystalline silicon layer 62 as shown in FIG. 14. The structure of FIG. 14 is then further etched in a plasma of CHF$_3$, C$_2$F$_6$ and He to remove the exposed portions of silicon dioxide layer 52 at the bottom of trench 48. Photoresist layer 58 is then removed using common ashing techniques. During this process, polycrystalline silicon layer 56 protects gate layer 54 to provide a high quality gate oxide beneath polycrystalline silicon layer 56. Polycrystalline silicon layer 64 is then deposited using low pressure chemical vapor deposition to a thickness of approximately 5,000 Angstroms as shown in FIG. 15. Polycrystalline silicon layer 64 completely fills the remainder of trenches 48 and 50. Some out diffusion from polycrystalline silicon layer 64 will extend into N+ doped region 16 to provide heavily doped region 66 as shown in FIG. 15. This provides a high conductivity connection from the surface of the integrated circuit to buried layer 16. Polycrystalline silicon layers 64 and 56 are then patterned to provide the structures shown in FIG. 16 completing the formation of buried layer contact region 66 and field effect transistor 68. Field effect transistor 68 comprises buried layer 16 which serves as a source, N+ layer 46 which serves as a drain and a gate provided by the combination of polycrystalline silicon layer 56 and 64 which controls the conductivity therebetween. The channel region of transistor 68 comprises the circumference of the trench, thus providing a very wide, high current capacity transistor in a compact area. In the shown embodiment, contact 66 provides conductive connection from the surface to buried region 16 thus providing a contact to the drain of transistor 68. Thus, a complete compact vertical transistor layout is provided.

It is an aspect of this invention that the methods herein described are compatible with the formation of BiCMOS circuitry. Other processing steps known in the art such as the formation of intrinsic and extrinsic base regions, and the formation of P channel and N channel field effect transistors can be effectively included with the processing steps shown herein. A more complete explanation of these steps may be found in copending application Ser. No. 129,261, filed Dec. 7, 1987 and assigned to the assignee of this application. This application is hereby incorporated by reference.

Although specific embodiments of the present invention are herein described, they are not to be construed as limiting the scope of the present invention. Further embodiments of the present invention will become obvious to those skilled in the art in light of the teachings of the specification. For example, the described embodiment uses contact 66 as a contact to a buried source. It could also be used as a contact to a buried collector in a bipolar transistor. The contact also could be formed without the thick field oxide 42 shown in the figures. In addition, contact 66 need not be formed in an N-well as shown but may advantageously be formed in a P-well or in the same well as transistor 68. Also, PMOS transistors may fabricated by substituting opposite doping types for P-well 36, source 16 and drain 46. Also, although the techniques described herein are directed towards crystalline silicon integrated circuit structures, other semiconductor types such as germanium and gallium arsenide may be used. Also, although the electrode formed in trench 50 is used as a gate for a field effect transistor, other uses such as for a capacitor are considered within the scope of the invention. In addition, although the contact 66 is shown as providing the contact for transistor 68, contacts to other elements of the integrated circuit fabricated using the techniques shown in this invention are considered within the scope of the invention. The scope of the invention is limited only by the claims appended hereto.

What is claimed is:

1. A method for forming a contact to a buried layer and an electrode, comprising the steps of:
   forming a buried layer spaced from a surface of a substrate;
   forming a first trench sidewalls and a bottom region in said substrate extending to said buried layer;
   forming a second trench sidewalls and a bottom regions in said substrate;
   forming an insulating layer on the sidewalls and the bottom regions of said first and second trenches;
   forming a protective layer on said insulating layer in the first and second trenches;
   anisotropically etching said protective layer to expose said insulating layer in the bottom region of said first trench;
   removing said exposed portion of said insulating layer to expose a portion of said buried layer; and
   forming a conductive layer from said surface into said first and second trenches lined with remainder of said insulating layer and said protective layer so that said conductive layer makes contact with said exposed portion of said buried layer said conductive layer in second trench forms said electrode.

2. The method of claim 1 wherein said substrate comprises crystalline silicon.

3. The method of claim 1 wherein said buried layer comprises a source region of a field effect transistor.

4. The method of claim 1 where said second trench extends from said surface to said buried layer.

5. The method of claim 1 further comprising the step of forming a doped region at the surface of said substrate adjacent said second trench and said first trench extending to said buried layer, said electrode formed in said second trench controlling current between said buried doped region and said doped region at the surface of said substrate.

6. The method of claim 1 wherein said buried layer comprises a collector of a bipolar transistor.

7. The method of claim 6 wherein said protective layer and said conductive layer are the same material.

8. The method of claim 7 wherein said material is polycrystalline silicon.

9. The method of claim 1 wherein said insulating layer comprises silicon dioxide.

10. The method of claim 9 wherein said silicon dioxide is formed by thermally oxidizing said substrate.

* * * * *